United States Patent [19]

Haugland

[11] Patent Number: 4,635,142
[45] Date of Patent: Jan. 6, 1987

[54] AMPLITUDE SENSOR WITH ADAPTIVE THRESHOLD GENERATION

[75] Inventor: Steve E. Haugland, Boulder County, Colo.

[73] Assignee: Storage Technology Corporation, Louisville, Colo.

[21] Appl. No.: 554,425

[22] Filed: Nov. 22, 1983

[51] Int. Cl.[4] .......................... G11B 5/02; G11B 5/03
[52] U.S. Cl. ...................................... 360/46; 307/358; 324/103 P; 360/66; 360/67
[58] Field of Search ................... 307/358, 360; 360/46, 360/66, 67; 324/103 P

[56] References Cited

U.S. PATENT DOCUMENTS

| | | | |
|---|---|---|---|
| 3,225,213 | 12/1965 | Hinrichs et al. | 307/360 |
| 3,502,993 | 3/1970 | Schurzinger et al. | 307/358 X |
| 3,638,183 | 1/1972 | Progler et al. | 307/358 X |
| 4,132,977 | 1/1979 | Nagano | 307/360 X |
| 4,375,037 | 2/1983 | Ikushima | 307/358 X |
| 4,385,328 | 5/1983 | Tanaka | 360/46 |

FOREIGN PATENT DOCUMENTS 54-11708  1/1979  Japan ..................... 360/46

*Primary Examiner*—Reinhard J. Eisenzopf
*Assistant Examiner*—Stephen M. Baker
*Attorney, Agent, or Firm*—Woodcock Washburn Kurtz Mackiewicz & Norris

[57] ABSTRACT

An improved amplitude sensing system for detecting the signal amplitude from the read head in a magnetic storage device wherein the signal amplitude is compared to a threshold voltage. When the signal amplitude is greater than the threshold voltage, the amplitude sensor output is high, indicating sufficient amplitude, and when the signal amplitude is less than the threshold voltage, the amplitude sensor output is low, indicating insufficient amplitude. The threshold voltage is selected to be the higher of a fixed minimum voltage, the minimum long term acceptable read head signal level, or an adaptive voltage derived from the peak voltages of the read head signal amplitude, which is a fixed percentage of the long term read head signal level. When the read head signal is not present for a long time, or while tape motion is starting, the fixed minimum voltage prevents invalid amplitude sensor output. When the read head signal is present, the adaptive voltage allows the threshold to vary with the characteristic signal output of the read head signal and the signal amplitude produced by different magnetic media.

6 Claims, 6 Drawing Figures

AMPLITUDE SENSOR WITH ADAPTIVE THRESHOLD GENERATION

BACKGROUND OF THE INVENTION

This invention relates to systems for converting flux transitions on moving magnetic media to binary data, and more particularly to systems for converting flux transitions in magnetic tape systems. Even more particularly, this invention relates to systems for detecting the presence of signals of sufficient amplitude to allow conversion of the flux transitions to binary data in a digital recording magnetic tape system.

The recording channel of a magnetic tape device presents unique detection requirements which are not found in devices with sealed media or constant speed such as disk drives. The magnetic coating of the tape is susceptible to drop-outs and wide variations in amplitude due to the type of coating, wear, and the length of time since the signal was placed on the tape. In addition, the amplitude varies as a function of the velocity of the tape past the read head and the amplitude also varies with the recording density. In a typical magnetic tape system, three different drive speeds are used, and three different recording densities are also used, resulting in nine combinations of speed and density found in the same read channel.

When data is written on magnetic tape, a read-back check is made using a separate read head, located behind the write head. During this read-back check, the signal amplitude requirement is higher than required during normal data reading, to ensure that the data will still be readable as the magnetic field on the tape degrades over time. This requirement adds two more combinations of amplitude, resulting in eighteen different combinations of read/write, speed and density which must be considered in determining if the proper amplitude is present at the output of the magnetic read head.

Problems also occur if the magnetic read/write head fails and must be replaced. Because of material and manufacturing variations, each head will have a different characteristic signal output level. This level must be normalized by adjusting the head amplifier gain so that the amplitude detection circuits will have the same signal margin. In order to properly perform this normalization adjustment, a specially recorded tape, with a precisely known recorded amplitude, must be used.

In prior art systems, these problems are solved by providing a gain adjustment on the amplifier, which must be readjusted periodically, and by providing different signal amplitude detection threshold levels for each combination of read/write, speed and density. These threshold levels were fixed, however, and could not change to adjust for media coating type, wear, or signal degradation over time. Also, these fixed threshold values required that the output of each magnetic head be normalized very precisely by adjusting its amplifier gain before amplitude detection can be reliable.

Amplitude sensing is an important part of the read circuitry of tape systems for digital data recording which record multiple tracks in parallel across the tape. In this type of system, error detection and correction methods are used extensively, such as parity checking across the parallel tracks or parity checking of the data bits in a single track. Loss of amplitude is an important indicator that a track is in error, and the correction methods can then be used to correct the track to avoid having to reposition and read the data again.

SUMMARY OF THE INVENTION

It is an object of the present invention to provide an improved system for accurately sensing the amplitude of the signal present at the output of a magnetic read head in a digital magnetic tape recording system.

Another object of the present invention is to provide an amplitude sensing system which dispenses with the head amplitude normalization adjustment.

A further object of the present invention is to provide an amplitude sensing system which dispenses with preset threshold levels for different tape speed and recording density combinations.

The above and other objects of the present invention are realized through the use of an adaptive threshold generator that comprises a peak detector which detects the peaks of the amplified and filtered read head signal, and produces a DC voltage which corresponds to these peaks. This output has a long time constant so that it responds slowly to changes in the read head signal amplitude. The DC voltage is then adjusted to be a fixed percentage of the peak of the signal amplitude and used as a threshold voltage to a comparator circuit. The percentage selected is based on the operation being performed—a lower percentage for a read operation, and a higher percentage for a read-back check during a write. If the read head signal stays above this threshold voltage, the amplitude sensor output is high, indicating sufficient amplitude, but if the read head signal drops below the threshold for more than a few cycles, the output of the amplitude sensor becomes low, indicating insufficient amplitude.

Since the peak detector output has a long time constant, it will not respond to short signal amplitude variations, or even drop-outs (total loss of signal). The threshold voltage based on the peak detector output is therefore adapted to the long term read head signal amplitude.

The threshold voltage must have a higher value when the circuit is performing a read-back check during a write operation, and a lower value when the circuit is operating during a read. This provides a check that data has been written properly and of sufficient amplitude to allow for normal degradation if the tape is not read for a long period of time. To allow for this, the threshold generator can select two percentages of the peak detector output based on the operation being performed.

To prevent invalid or unstable amplitude sensor output while tape motion is starting and before the peak detector has stabilized, a minimum threshold voltage is provided by the threshold generator. This threshold voltage represents the minimum long term acceptable read head signal level. It also prevents a long term low amplitude signal from being considered acceptable, since the comparator circuit will always compare to the higher of the minimum threshold voltage or the adaptive threshold voltage.

BRIEF DESCRIPTION OF THE DRAWINGS

The above and other objects, features, and advantages of the present invention will be more apparent from the following more particular description of the preferred embodiment presented in connection with the following drawings, wherein.

DESCRIPTION OF THE PREFERRED EMBODIMENT

The following is a descrption of the best presently contemplated mode of carrying out the present invention. This description is given only to illustrate the general principles of the invention and is not to be taken in a limiting sense. The true scope of the invention can be ascertained by reading the appended claims.

Figure 1:
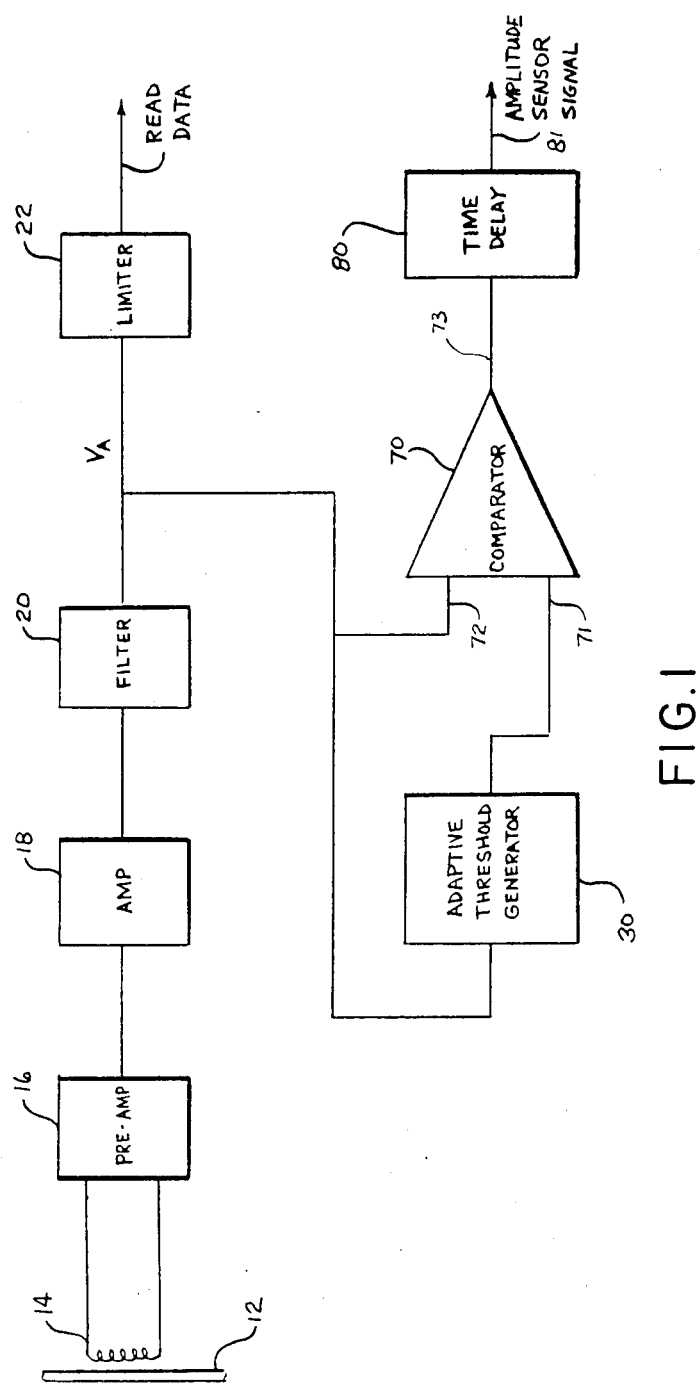
FIG. 1 is a functional block diagram of the read section of a recording channel in a digital magnetic tape system and depicts the environment in which the adaptive threshold generator of the present invention is typically used.

FIG. 1 is a functional block diagram of a read section 10 of a recording channel of a digital magnetic tape system, and is shown to illustrate the environment in which the present invention would likely be used. Magnetic flux changes on a tape 12 are sensed by a magnetic read head 14, and amplified by a pre-amplifier 16 and an amplifier 18. A filter 20 is a bandpass filter used to differentiate an amplified read head signal appearing at the output of the amplifier 18, and to limit the read channel bandwidth for noise immunity. The output signal of filter 20 is an analog signal $V_A$ which is converted to read data by a limiter circuit 22.

The analog signal $V_A$ of the filter 20 is connected to an adaptive threshold generator 30 where it is used to generate a threshold voltage output signal which is connected to input 71 of a comparator circuit 70. The analog signal output $V_A$ of filter 20 is also connected to input 72 of the comparator circuit 70. The comparator circuit 70 compares the signal at input 72 to the signal at input 71 and if the signal at input 72 is a higher voltage than the signal at 71, an output signal 73 of the comparator circuit 70 goes high; and if the signal at input 72 is a lower voltage than the signal at input 71, the output signal 73 goes low.

A time delay circuit 80 is used to prevent very short term analog signal amplitude changes from changing an amplitude sensor output signal 81. The time delay circuit 80 is set so that several cycles of a high signal output 73 of the comparator circuit 70 are required before the amplitude sensor output signal 81 will become high; and several cycles of a low signal output 73 of the comparator circuit 70 are required before the amplitude sensor output signal 81 will become low. The number of cycles required is a function of the particular system and may not be the same for the low to high transition as for the high to low transition. Typically ten cycles of the analog signal $V_A$ must occur before the low to high transition, and five cycles must occur before the high to low transition.

Figure 6:
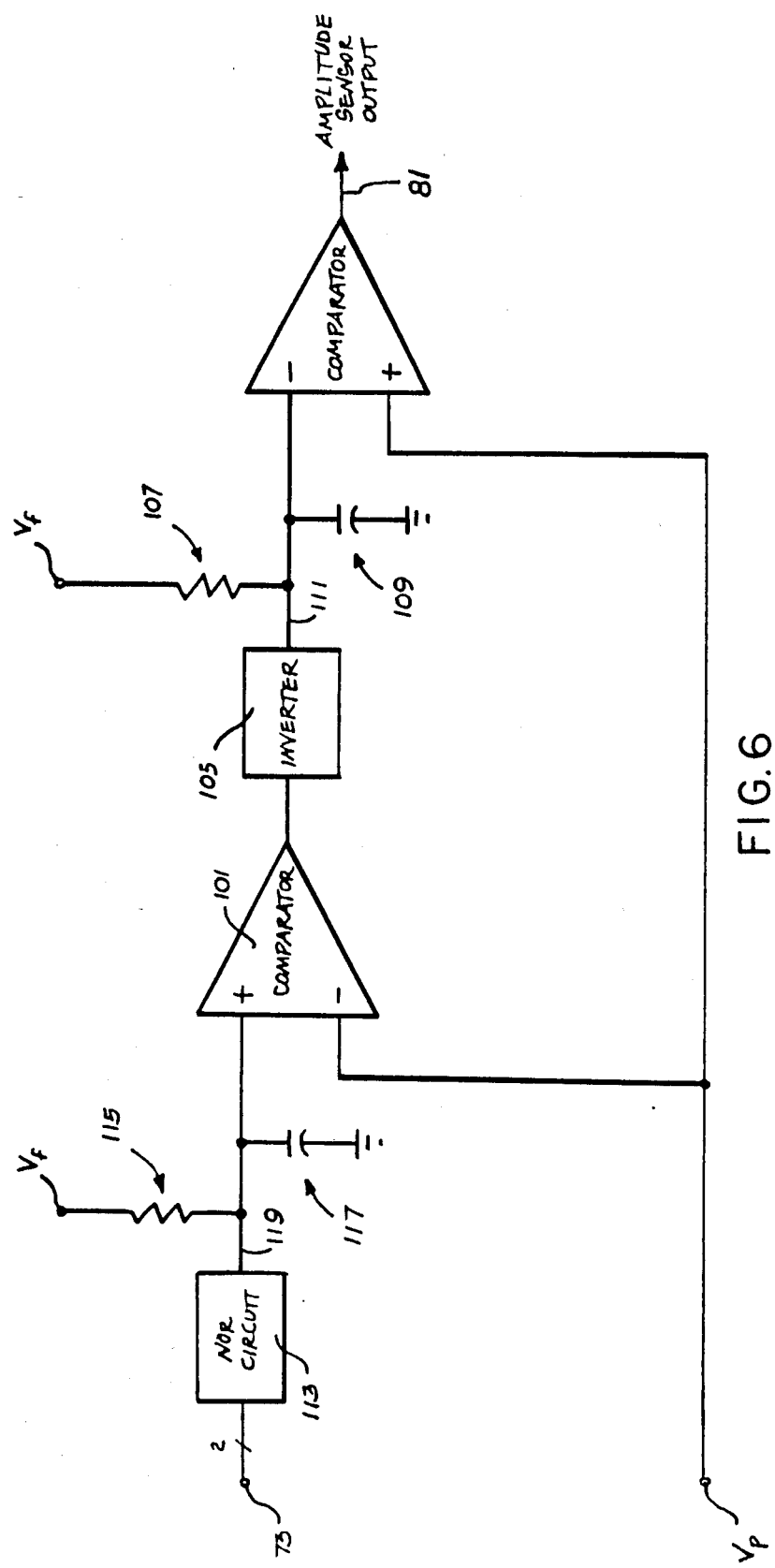
FIG. 6 is a schematic diagram of the time delay shown in FIG. 2.

As is shown more clearly in FIG. 6, the time delay circuit 80 may be suitably comprised of a pair of comparators 101 and 103, and associated circuitry, which generate the appropriate delays which must occur before the low to high transition and high to low transition respectively. The amplitude sensor output signal 81 goes to a high level when successive $V_A$ cycles are detected above the reference voltage, that is the threshold voltage output signal which is connected to input 71, for a period of time equal to a specified number of high density cycles. This period of time is referred to as the amp sense pick time, and is equal to (ignoring circuit propagation delays):

$$T_p = -R2\, C2\, \ln\left(\frac{V_f - V_p}{V_f - V_i}\right)$$

where $V_f$ equals the high voltage level of the amplitude sensor output signal 81, $V_p$ is a selected DC level depending on density and tape speed, $V_i$ is the collector saturation voltage of inverter 105, R2 is the resistance of resistor 107, and C2 is the capacitance of capacitor 109. The pick time $T_p$ is initiated by an open collector inverted output 111 of comparator 101 going off (refer to FIG. 5).

The amplitude output signal 81 goes to a low level when the analog $V_A$ is absent (or the amplitude is less then the reference voltage at input 71) for a period of time equal to a specified number of high density cycles. This period of time is referred to as the amp sense drop time and is equal to (ignoring circuit propagation delays).

$$T_d = -R1\, C1\, \ln\left(\frac{V_f - V_p}{V_f - V_i}\right)$$

where $V_i$ is the collector saturation voltage of nor circuit 113, R1 is the resistance of resistor 115, and C1 is the capacitance of capacitor 117. The drop time is initiated by the open collector inverted output 119 of comparator 70 going off (referring to FIG. 5).

As has been pointed out herein above, the pick time is equal to a period of time in which ten cycles of the analog signal $V_A$ must occur before the low to high transition, while the drop time is equal to a period of time in which five cycles of the analog signal $V_A$ must occur before the high to low transition. By way of example, the time delay circuitry 80 shown is FIG. 6 are contained in an amp sense with adaptive threshold integrated circuit, part number 7BD023, available from Storage Technology Corporation.

Figure 2:
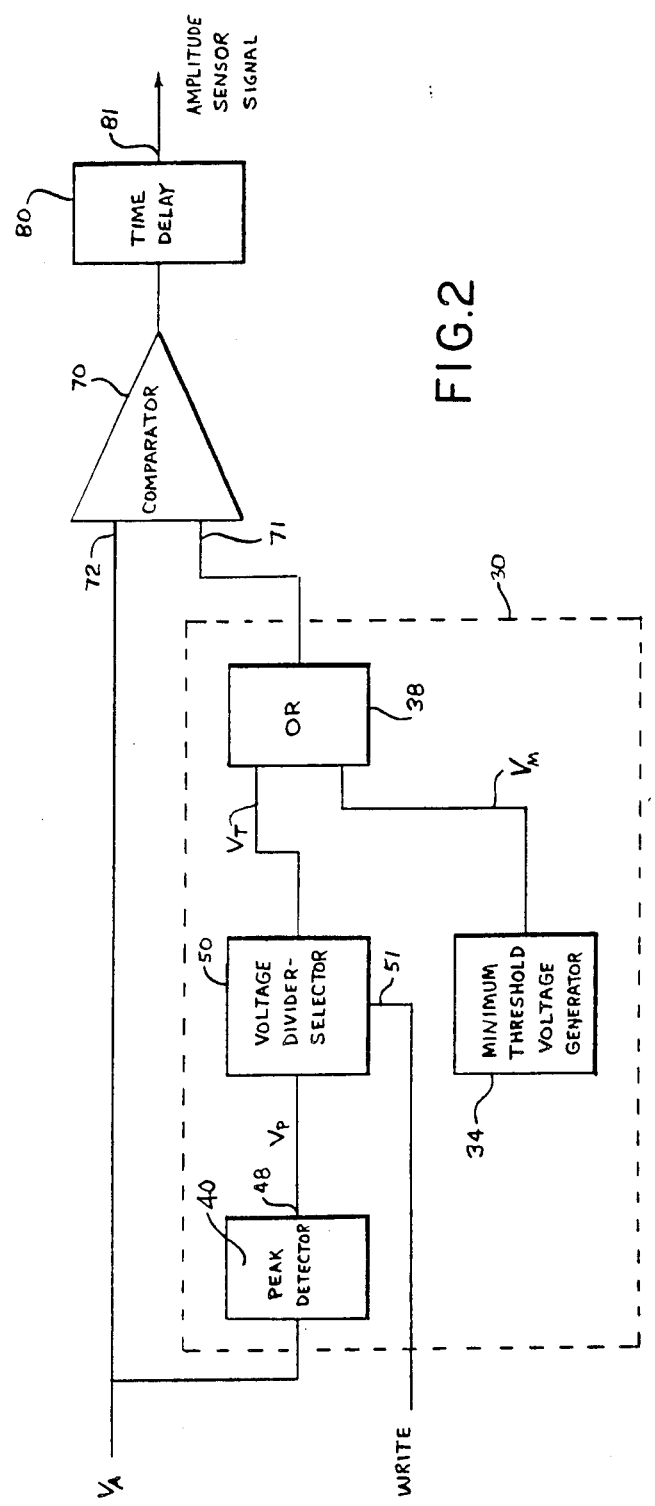
FIG. 2 is a functional block diagram of the adaptive threshold generator shown in FIG. 1.

FIG. 2 is a functional block diagram of the adaptive threshold generator 30 shown in FIG. 1. The analog signal $V_A$ is connected to a peak detector circuit 40 which senses the peaks of the analog signal $V_A$ to provide a peak voltage signal $V_P$ at 48 which is substantially equal to the peak voltage of the analog signal $V_A$. The peak detector circuit has a long time constant so that the peak voltage $V_P$ will change very slowly with respect to the peaks of the analog signal $V_A$. The peak voltage $V_P$ is connected to a voltage divider-selector circuit 50 where it is reduced to two levels, each of which is a fixed percentage of the peak voltage $V_P$. A write signal input 51 to the voltage divider-selector circuit 50 is used to select one of the two levels which is output as an adaptive threshold voltage $V_T$ at 58. A minimum threshold voltage $V_M$ is created by a minimum threshold voltage generator circuit 34. The greater of the adaptive threshold voltage $V_T$ and the minimum threshold voltage $V_M$ is selected by an analog OR function circuit 38 and is input to the comparator circuit 70 on input 71. The comparator circuit 70 and the time delay circuit 80 were shown and described in FIG. 1.

Figure 3:
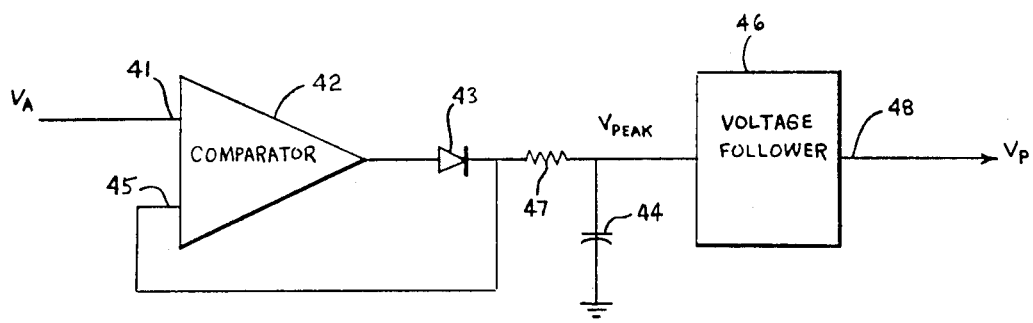
FIG. 3 is a schematic diagram of the peak detector shown in FIG. 2.

FIG. 3 is a schematic diagram of the peak detector circuit 40 shown in FIG. 2. The analog signal $V_A$ is input to a comparator circuit 42 at input terminal 41. If this signal is greater than a $V_{PEAK}$ signal at terminal 45, the output of comparator circuit 42 is high which turns on a diode 43 to charge a capacitor 44 through a resistor 47 very quickly to the peak value of the analog signal $V_A$. The capacitor 44 is selected to maintain a relatively constant $V_{PEAK}$ during analog signal $V_A$ drop-out conditions, typically several hundred cycles of the analog signal $V_A$. The resistor 47 is selected, in conjunction with the capacitor 44, to provide short term filtering for the peak detector charge-up response. A voltage follower circuit 46 is used to isolate the voltage $V_{PEAK}$ from a peak voltage signal $V_P$ at output 48, to ensure a long time constant for the discharge of the capacitor 44. By way of example, the comparator circuit 42, the diode 43, and the voltage follower 46 are contained in an amp sense with adaptive threshold integrated circuit, part number 7BD023, available from Storage Technology Corporation. Resistor 47 is typically 47 ohms, and capacitor 44 is typically 0.1 microfarads.

Figure 4:
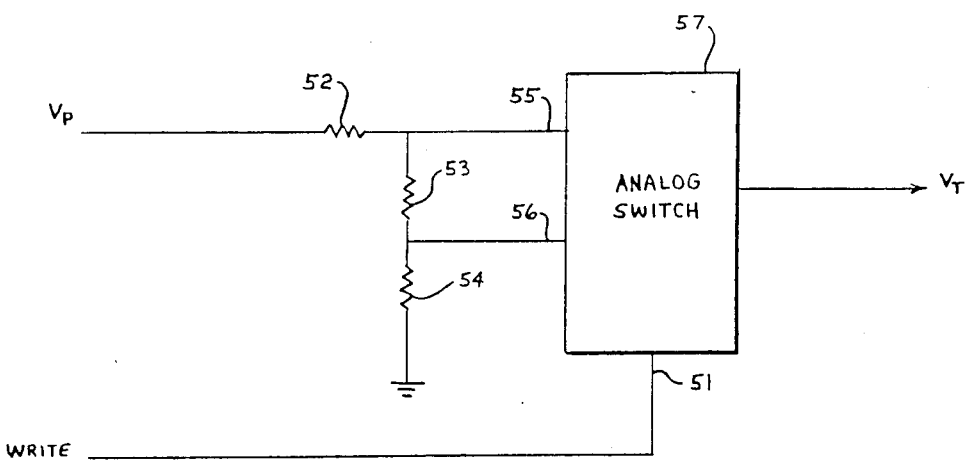
FIG. 4 is a schematic diagram of the voltage divider-selector shown in FIG. 2.

FIG. 4 is a schematic diagram of the voltage divider-selector circuit 50 shown in FIG. 2. The peak voltage $V_P$ is connected to a resistor 52 which is connected to resistors 53 and 54 to form a resistive voltage divider circuit. A read threshold voltage output of the resistive voltage divider is connected to the analog switch circuit 57 at input 56 and a read-back check threshold voltage output of the resistive voltage divider circuit is connected to the analog switch circuit 57 at input 55. The resistors 52, 53, and 54 are selected so that the read-back check threshold voltage is a fixed percentage of the peak voltage signal $V_P$, typically 20 percent, and the read threshold voltage is less than the read-back check threshold voltage, typically 10 percent of the peak voltage signal $V_P$. The write signal input 51 to the analog switch circuit 57 is used to select the read or read-back check threshold voltage to be output as signal $V_T$ at 58. Other circuits might use a plurality of threshold voltages without changing the characteristics of the threshold generator. The analog switch is contained in an amp sense with adaptive threshold voltage integrated circuit, part number 7BD023, available from Storage Technology Corporation.

Figure 5:
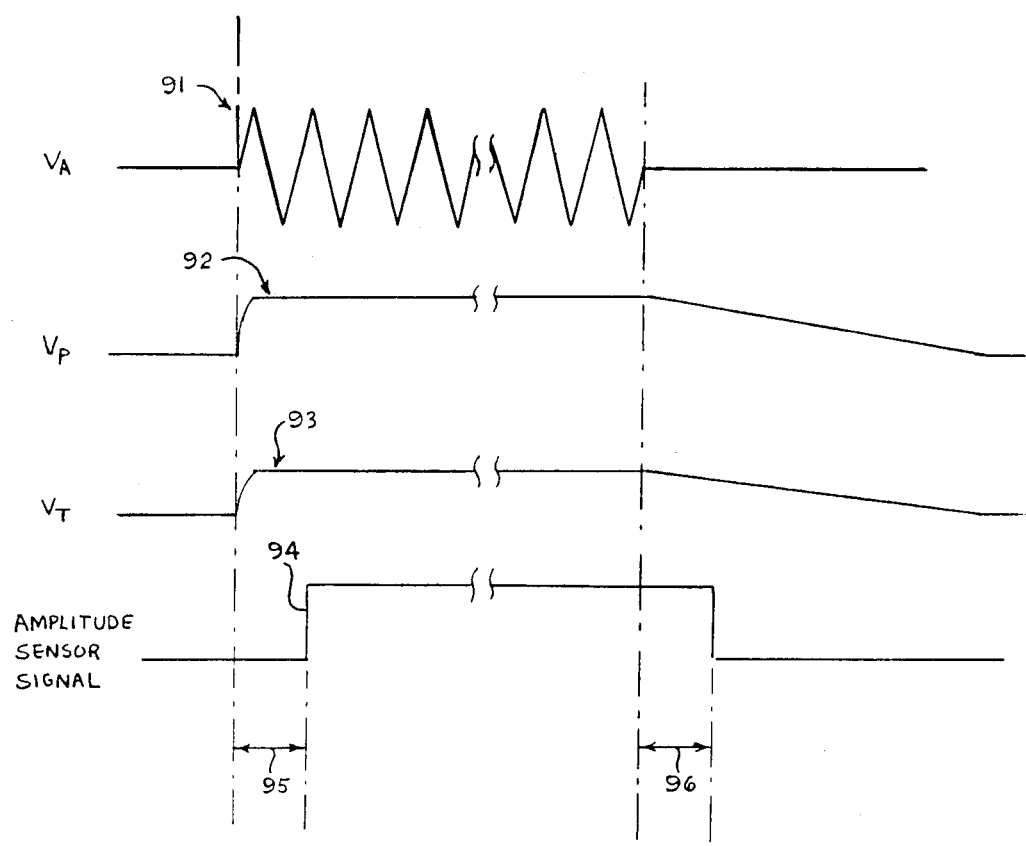
FIG. 5 illustrates signal waveforms appearing at various locations in FIG. 2.

FIG. 5 illustrates signal waveforms appearing at various locations on FIG. 2. The analog signal $V_A$ input to the comparator circuit 70 at input 72 in FIG. 2 is shown at 91 in FIG. 5. The voltage peak $V_P$ output 48 of the peak detector circuit 40 in FIG. 2 is shown at 92 in FIG. 5. The threshold voltage $V_T$ output 58 of the voltage divider-selector circuit 50 in FIG. 2 is shown at 93 in FIG. 5. The amplitude sensor output signal 81 of the time delay circuit 80 in FIG. 2 is shown at 94 in FIG. 5. The delay shown at 95 represents the low to high transition time delay output and the delay shown at 96 represents the high to low transition time delay output.

Typically, the analog signal $V_A$ 91 varies from zero to one volt peak; the peak voltage $V_P$ 92 varies from zero to one volt; the threshold voltage $V_T$ 93 varies from zero to 200 millivolts for the read-back check, and zero to 100 millivolts for the read; and the amplitude sensor output signal 94 varies from zero to four volts. The delay or pick time 95 is typically ten cycles of the analog signal $V_A$, and the delay or drop time 96 is typically five cycles of the analog signal $V_A$.

While the invention herein disclosed has been described by means of a specific embodiment and application thereof, numerous modifications and variations could be made thereto by those skilled in the art without departing from the spirit and scope of the present invention. It is therefore to be understood that within the scope of the appended claims, the invention may be practiced otherwise than as specifically described herein.

Further details associated with the 7BD023 integrated circuit, made by Storage Technology Corporation, may be found in the document IC, AMP SENSE WITH ADAPTIVE THRESHOLD, which document is incorporated by reference herein.

What is claimed is:

1. An amplitude sensing system for sensing the presence of a cyclic analog signal produced by a magnetic head as it converts magnetic flux variations on a magnetic recording medium having a predetermined density and speed of recording into electric variations, said system comprising:
    (a) peak detecting means connected to said analog signal for sensing voltage peaks and for providing a first output voltage substantially equal to said voltage signal peaks for a long time period relative to the frequency of said analog signal;
    (b) means for generating a threshold voltage proportional to said first output voltage;
    (c) first comparator means for comparing said analog signal to said threshold voltage and for producing a second output voltage having first and second levels, said second output voltage changing from said first level to said second level when said analog signal exceeds said threshold voltage, and said second output voltage changing from said second level to said first level when said analog signal becomes less than said threshold voltage, whereby said second output voltage cycles follow said analog signal cycles; and
    (d) time delay means for receiving said second output voltage and for generating an amplitude sensor voltage having first and second levels, said time delay means comprised of a NOR circuit receiving said second output voltage, second comparator means including a first resistance-capacitance network coupled to said NOR circuit for determining a drop time period, an inverter coupled to receive the output of said second comparator means, and third comparator means including a second resistance-capacitance network coupled to receive the output of said inverter for determining a pick time period, wherein said amplitude sensor voltage changes from said first level to said second level after a number of cycles of said second output voltage representative of said pick time period, and said amplitude sensor voltage changes from said second level to said first level after a number of cycles of said second output voltage representative of said drop time period.

2. An amplitude sensing system as defined in claim 1 wherein said threshold voltage generated by said threshold voltage generating means is a predetermined fraction of said first output voltage of said peak detecting means.

3. An amplitude sensing system as defined in claim 2 wherein said threshold voltage generating means comprises a voltage divider circuit.

4. An amplitude sensing system as defined in claim 1 wherein said threshold voltage generating means includes means for selecting the greater of one of a plurality of threshold voltages.

5. An amplitude sensing system as defined in claim 4 wherein one of said threshold voltages is a fixed DC voltage.

6. An amplitude sensing system as defined in claim 5 wherein said fixed number of cycles is ten and said fixed time period is equal to five cycles of said second output voltage.

* * * * *